(12) United States Patent
Edwards

(10) Patent No.: US 7,291,913 B2
(45) Date of Patent: Nov. 6, 2007

(54) SYSTEM AND METHOD FOR HIGH PERFORMANCE HEAT SINK FOR MULTIPLE CHIP DEVICES

(75) Inventor: Darvin R. Edwards, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 105 days.

(21) Appl. No.: 11/240,858

(22) Filed: Sep. 30, 2005

(65) Prior Publication Data

US 2006/0060988 A1 Mar. 23, 2006

Related U.S. Application Data

(62) Division of application No. 10/749,610, filed on Dec. 31, 2003, now Pat. No. 6,979,899.

(51) Int. Cl.
*H01L 23/12* (2006.01)

(52) U.S. Cl. ............ 257/704; 257/719; 257/720; 257/724; 257/E23.101; 438/119; 438/122

(58) Field of Classification Search ............ 257/704
See application file for complete search history.

(56) References Cited

U.S. PATENT DOCUMENTS

| 5,623,394 | A | 4/1997 | Sherif et al. ............ 361/705 |
| 5,819,402 | A | 10/1998 | Edwards et al. ............ 29/840 |
| 6,656,770 | B2 | 12/2003 | Atwood et al. ............ 438/118 |
| 6,724,078 | B1 | 4/2004 | Sur et al. ............ 257/704 |
| 6,756,668 | B2 | 6/2004 | Baek et al. ............ 257/704 |
| 2003/0080411 | A1* | 5/2003 | Baek et al. ............ 257/704 |
| 2003/0178730 | A1 | 9/2003 | Rumer et al. ............ 257/778 |
| 2004/0000712 | A1* | 1/2004 | Wilson et al. ............ 257/712 |

\* cited by examiner

*Primary Examiner*—Tu-Tu Ho
(74) *Attorney, Agent, or Firm*—Yingsheng Tung; Wade James Brady, III; Frederick J. Telecky, Jr.

(57) ABSTRACT

A custom-molded heat sink corresponds to an individual substrate and includes a heat sink lid having at least one cavity corresponding to at least one die mounted on a substrate. A conductive layer is deposited in the at least one cavity that substantially fills the space between the at least one cavity and the at least one die when the lid is coupled to the substrate.

10 Claims, 1 Drawing Sheet

SYSTEM AND METHOD FOR HIGH PERFORMANCE HEAT SINK FOR MULTIPLE CHIP DEVICES

This is a divisional application of application Ser. No. 10/749,610 filed Dec. 31, 2003, now U.S. Pat. No. 6,979,899, the contents of which are herein incorporated by reference in its entirety.

TECHNICAL FIELD OF THE INVENTION

This invention relates generally to multiple chip devices, and more particularly to a system and method for removing heat from a multiple chip device.

BACKGROUND OF THE INVENTION

Multi-chip semi-conductor devices are generally manufactured by mounting multiple dies onto a substrate. Many of these dies are of different dimensions due to the different functions performed by the multi-chip devices. Accordingly, heat sinks manufactured to dissipate heat from the individual devices mounted on a substrate or a multi-chip module (MCM) or an application specific integrated circuit (ASIC) often have cavities corresponding to the number of devices mounted on any given MCM or ASIC, and are generally of uniform dimension.

In order to conduct heat from the semi-conductor devices to the heat sink for dissipation, an epoxy is generally used to fill the space between individual dies on the substrate and the cavity interior. These epoxies generally have low thermal conductivity, which in turn reduces the amount of heat that the heat sink lid can dissipate from the semi-conductors. Due to the dependence of the heat removed from the semi-conductor device on the thickness of the epoxy that fills the space between the individual dies and the substrate and the cavity interior, the size of the gap between the device and the lid must be tightly controlled. In a typical MCM, there can be height variations between the semi-conductor devices, resulting in the space between the devices and the cavities in the heat sink lid being uncontrolled. These height variations lead to variations of the epoxy lid attach thickness which in turn leads to differences in cooling efficiencies from one die to another and from one MCM assembly to another.

SUMMARY OF THE INVENTION

In accordance with embodiments of the present invention, problems associated with the removal of heat from multi-chip modules and application-specific integrated circuits are substantially reduced or eliminated. In one embodiment, a method includes a conductive layer placed between each individual die and each cavity formed in the heat sink lid to increase the conductivity for the heat sink apparatus. The conductive layer is preferably a material with a relatively low liquidous point, thus enabling the material of the conductive layer to be heated and dispersed within the cavity maintaining contact with the die. Additional embodiments of the invention may include cooling the assembly of the lid and substrate, removal of the lid, and subsequent application of an adhesive layer to secure the assembly of the lid to the substrate. In another embodiment of the present invention, a system is provided that includes a thermally conductive lid, a conductive layer deposited within cavities formed in the lid, and a semi-conductor device that includes one or more dies mounted on a substrate corresponding to cavities in the thermally conductive lid. In this embodiment, the lid is preferably assembled to the substrate, so that when heated, the conductive layer fills the space between the dies mounted on a substrate and the cavities formed in the lid to create a thermally conductive region between the die and the lid.

An advantage of the present invention includes increasing the thermal conductivity of the assembly of the lid to the semi-conductor device. Yet another advantage includes the ability to manufacture lids having cavities of uniform dimension thus allowing for the melted conductive layer to form a mold corresponding to the die inserted into each cavity when the lid is mounted to the substrate. Embodiments of the present invention may include some, none, or all of the enumerated advantages. Additional advantages will be apparent to those of ordinary skill in the art.

BRIEF DESCRIPTION OF THE DRAWINGS

For a more complete understanding of the present invention and the advantages thereof, reference is now made to the following description taken in conjunction with the accompanying drawings.

DETAILED DESCRIPTION OF THE INVENTION

Multi-chip modules (MCMs) are semiconductor devices with more than one die mounted on a substrate. During operation, these semiconductor devices generate heat that must be dissipated to allow the semiconductor device to continue functioning properly. Accordingly, current methods of heat dissipation include mounting a lid having cavities with substantially uniform dimensions corresponding to each die on the substrate. This lid or heat sink is generally mounted to the substrate so that the individual dies of the semiconductor device fit inside the cavities of the lid. Often, the individual dies on the substrate of an MCM or ASIC have varying heights and dimensions, thus resulting in gaps of varying sizes between the dies and the surface of the lid cavities. In order to dissipate heat from the dies to the heat sink link, epoxies are often used to fill the gaps between the dies and the cavity. Unfortunately, most epoxies have very poor thermally conductive properties. For example, most epoxies generally used to fill the space between the dies and the cavities have a thermal conductivity of between 1-8 W/m-° C. The lids, alternatively, have a thermal conductivity of approximately 150-400 W/m-° C. Accordingly, the amount of heat able to be dissipated by the heat sink lid is dependent on the ability of the epoxy between the lid cavity and the die of the semiconductor device to conduct heat or energy from the semiconductor device to the lid, and upon the thickness of the epoxy material.

Figure 1:
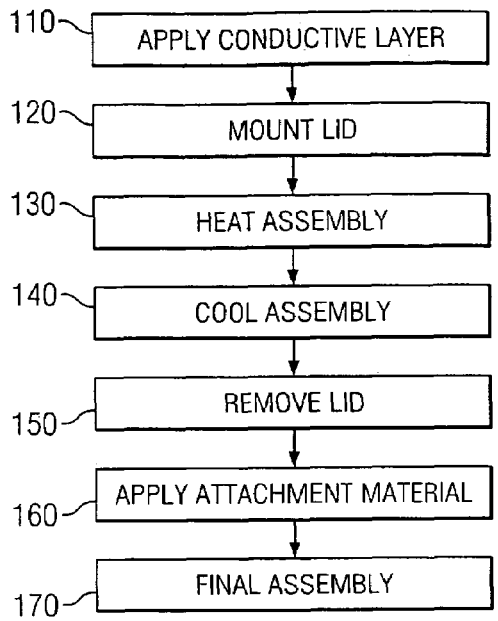
FIG. 1 is a flowchart illustrating a method according to an embodiment of the present invention.

FIG. 1 illustrates a method for increasing the thermal conductivity of a heat sink device for a semiconductor device. At step 110, a conductive layer is applied within each cavity of a heat sink lid for a semiconductor device. At step 120, the lid is mounted on the substrate by coupling the lid to the substrate in such a manner that the individual dies mounted on the substrate are inserted into corresponding cavities formed in the lid. At step 130, the assembly of the lid and semiconductor device is heated in order to liquefy the conductive layer deposited in each lid cavity. The conductive layer deposited in each lid cavity is preferably a low temperature solder, such as most tin-lead (Sn—Pb) solder, indium solder, a eutectic solder such as Sn—Pb solders, or any other thermally conductive material that is sufficiently malleable when heated to mold to the shape of the die inserted into the cavity and then re-solidified when cooled. Preferably, the thermal conductivity of the conductive layer is greater than 10 W/m-° C. When the assemblies are pressed together at step 130, the conductive layer preferably spreads out to fill any space caused by the difference in dimensions of the die versus the cavity. In any given embodiment, the dies may provide for a large gap, or a smaller gap between the die and the cavity. Accordingly, a uniform amount of conductive layer material may be placed in each cavity so that when heated, the conductive layer may be pressed along the top and around portions of the sides of the dies having larger dimensions, and may only be spread across the top of dies having smaller dimensions.

At step 140, the assembly is cooled thereby solidifying the conductive layer material in the form to which it assumed upon being heated at step 130. At step 150, the lid is removed from the substrate to allow for an adhesive layer to be placed on the substrate and/or each die to bond the lid to the substrate. The adhesive material may be traditional adhesive, such as a glue, an epoxy-based adhesive, or any other material with a thermal conductivity of greater than 1 W/m-° C. that is suitable to attach the lid assembly to the substrate. At step 170, the lid is assembled to the substrate using the attachment material applied at step 160 to secure the lid to the substrate.

In addition to eutectic solder, certain thermoplasics may be used as film material which may obviate this step 130 of heating the assembly. For example, a thermoplastic material filled with silver, carbon fibers, or diamond, may be deposited within the cavity, which, when the lid is coupled to the substrate, may be pressed around the die inserted into each cavity to form a mold corresponding to the space between the cavity and the die. In such an embodiment, the thermoplastic material may be mixed, applied to the interior of the cavity, and when the lid is mounted to the substrate, the assembly may need only to be allowed to harden for a period of time necessary to allow the thermoplastic material to solidify.

Figure 2:
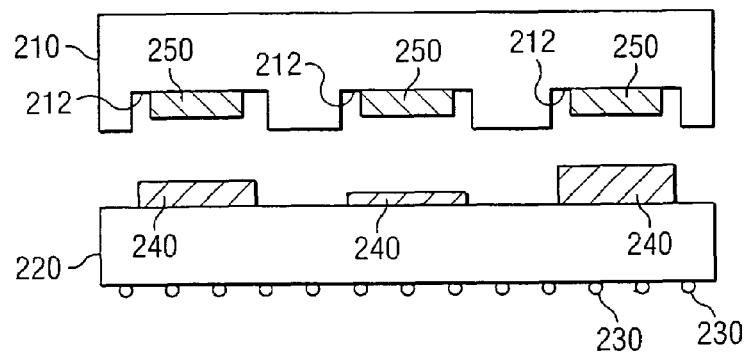
FIG. 2 is an example of a system for dissipating heat in accordance with an embodiment of the present invention.
Figure 2A:
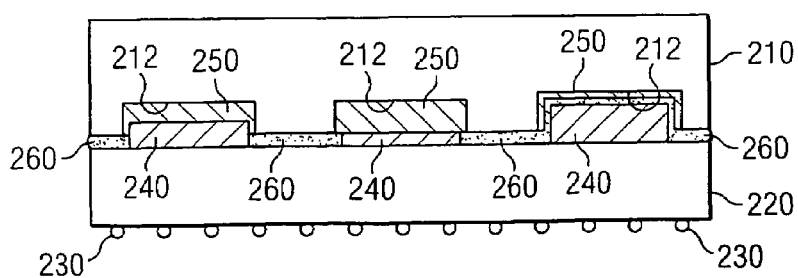
FIG. 2A is an example of a system for dissipating heat in accordance with an embodiment of the present invention.

FIGS. 2 and 2A illustrate a system 200 for dissipating heat from a semiconductor device. A lid 210 preferably has cavities 212 formed within the lid. These cavities preferably correspond to the number of dies 240 mounted on substrate 220 of the semiconductor device. Additionally, conductive layer 250 is preferably deposited within each cavity corresponding to a semiconductor device. It should also be noted, that for any given embodiment, the number of cavities may be greater than the number of dies 240 mounted on substrate 220. For example, the number of cavities 212 formed in lid 210 for use as a heat sink for system 200 may be greater than the number of dies 240 mounted on substrate 220. Preferably, the number of cavities is equal to of the number of dies 240 mounted on substrate 220 to ensure that each die has a cavity and lid 210 may be mounted substantially flush with substrate 220. Alternatively, larger cavities may be used that cover multiple dies.

Conductive layer 250 is preferably deposited in each cavity 212, and may be made of any conductive material. Preferably, the conductive layer has a conductivity of at least 10 W/m-° C. Conductive layer 250 is preferably a eutectic solder, but may be any material with thermally conductive properties that may molded to fill the space between a cavity 212 and a die 240.

FIG. 2A illustrates a system 200 in assembled form. Preferably, the lid 210 is placed over substrate 220 so that each die 240 is inserted into a cavity 212 so that conductive layer 250 is between die 240 and the cavity 212. After mating the lid 210 to the substrate 220, the assembly is preferably heated, thereby liquefying the conductive layer so that conductive layer 250 fills the space between the surface of die 240 and the interior surface of a cavity 212. In this embodiment, a eutectic solder is preferably used, that may include a Sn—Pb solder, an indium-based solder, or a lead-free solder. Alternatively, a conductive thermoplastic layer may be used as conductive layer 250, so that heating the assembly is not required. After conductive layer 250 has been molded to fill the space between a cavity 212 and a die 240, the lid 210 is preferably removed. In the case of a conductive layer 250 made of a solder, the assembly must be cooled to allow the solder to solidify before removing the lid 210. The lid is preferably removed after the conductive layer 250 has achieved substantially a solid phase. Once the lid 210 having molded conductive layer 250 is removed from the substrate 220, a binding layer 260 is preferably deposited on the die 240, the substrate 220, or lid 210, but in either case deposited in such a manner that lid 210, when placed on substrate 220, has the binding layer 260 present at at least some of the points at which conductive layer 250 contacts die 240. Binding layer 260 may be an epoxy, an adhesive, or any other material suitable to bind lid 210 to substrate 220, and preferably has a thermal conductivity greater than 1 W/m-° C.

Although the present invention has been described in detail, it should be understood that various changes, substitutions, and alterations may be made, without departing from the spirit and scope of the present invention as defined by the claims.

What is claimed is:

1. A method for removing heat from a semiconductor device on a substrate, comprising:

forming a lid having at least one cavity;

a first die of a first thickness and a second die of a second thickness different from the first thickness mounted on a substrate;

depositing a conductive material having a viscosity within the at least one cavity, the conductive material comprising a material having a thermal conductivity greater than 10 W/m-° C.;

mating the lid to the substrate thereby placing the at least one cavity over the first die and the second die; and heating the conductive material thereby reducing its viscosity and thereby forming a first layer of the conductive material having a third thickness between the first die and the lid and a second layer of the conductive material having a fourth thickness different from the third thickness between the second die and the lid;

cooling the conductive material thereby increasing the viscosity of the conductive layers, thereby retaining the thickness of the first conductive layer and the second conductive layer within the at least one cavity, lifting the lid and the conductive layers from the dies and the substrate;

applying additional binding material between the lid and the dies and the substrate; and mating the lid to the substrate, thereby securing the lid to the substrate.

2. The method of claim 1, wherein the conductive material comprises a metallic solder.

3. The method of claim 2, wherein the solder comprises eutectic Sn—Pb solder.

4. The method of claim 2, wherein the solder has a melting point of less than 200° C.

5. The method of claim 2, wherein the solder comprises an indium-based solder.

6. The method of claim 2, wherein the solder is lead-free.

7. The method of claim 1, wherein the conductive material is a conductive thermoplastic.

8. The method of claim 7, wherein the conductive thermoplastic is silver-filled.

9. The method of claim 1, wherein the at least one cavity comprises at least two cavities with similar dimensions.

10. The method of claim 1, wherein the semiconductor device is a multi-chip module.

* * * * *